(12) United States Patent
Braun

(10) Patent No.: US 7,180,113 B2
(45) Date of Patent: Feb. 20, 2007

(54) DOUBLE-DECKER MRAM CELL WITH ROTATED REFERENCE LAYER MAGNETIZATIONS

(75) Inventor: Daniel Braun, Paris (FR)

(73) Assignees: Infineon Technologies AG, Munich (DE); Altis Semiconductor, Corbeil Essonnes Cedex (FR)

( * ) Notice: Subject to any disclaimer, the term of this patent is extended or adjusted under 35 U.S.C. 154(b) by 70 days.

(21) Appl. No.: 11/054,854

(22) Filed: Feb. 10, 2005

(65) Prior Publication Data
US 2006/0175675 A1 Aug. 10, 2006

(51) Int. Cl.
*H01L 27/94* (2006.01)
*G11C 11/00* (2006.01)

(52) U.S. Cl. .............. 257/295; 257/E21.665; 365/158

(58) Field of Classification Search .......... 257/195, 257/E21.665, 295; 438/3
See application file for complete search history.

(56) References Cited
U.S. PATENT DOCUMENTS

| | | | |
|---|---|---|---|
| 6,385,082 B1 | 5/2002 | Abraham et al. | |
| 6,531,723 B1 | 3/2003 | Engel et al. | |
| 6,545,906 B1 | 4/2003 | Savtchenko et al. | |
| 6,667,897 B1 | 12/2003 | Abraham et al. | |
| 6,754,097 B2 | 6/2004 | Sharma et al. | |
| 6,888,742 B1 * | 5/2005 | Nguyen et al. | 365/158 |
| 6,985,385 B2 * | 1/2006 | Nguyen et al. | 365/173 |
| 2004/0042263 A1 | 3/2004 | Sharma et al. | |

OTHER PUBLICATIONS

Cullity, B.D., "Introduction to Magnetic Materials," Addison-Wesley, pp. 238-240 (1972).

* cited by examiner

*Primary Examiner*—Long Tran
(74) *Attorney, Agent, or Firm*—Dicke, Billig & Czaja, PLLC

(57) ABSTRACT

A double-decker MRAM cell is provided, including a stacked structure of first and second magnetic tunnel junctions. Each magnetic tunnel junction includes first and second free and fixed magnetic regions made of magnetic material separated by a first and second tunneling barrier layers made of non-magnetic material. The fixed magnetic regions are pinned by at least one pinning layer. The first and second fixed magnetizations are oriented in a same magnetic anisotropy axis and are inclined under an angle relative to at least one of said first and second free magnetizations.

14 Claims, 3 Drawing Sheets

FIG 1A
(PRIOR ART)
FIG 1B
(PRIOR ART)
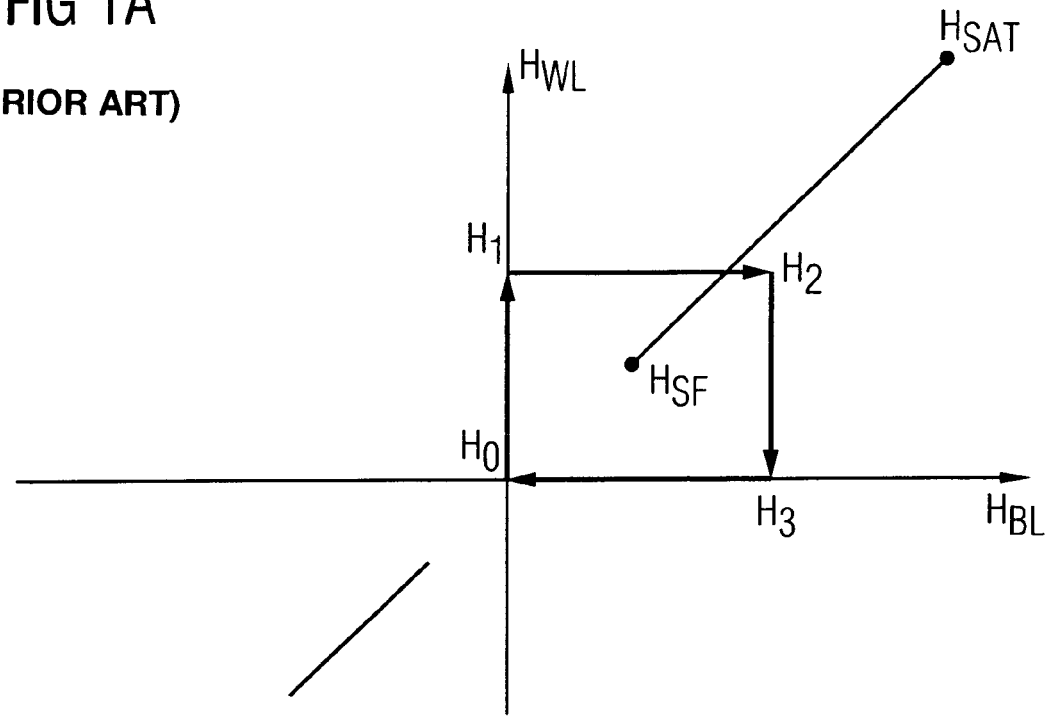
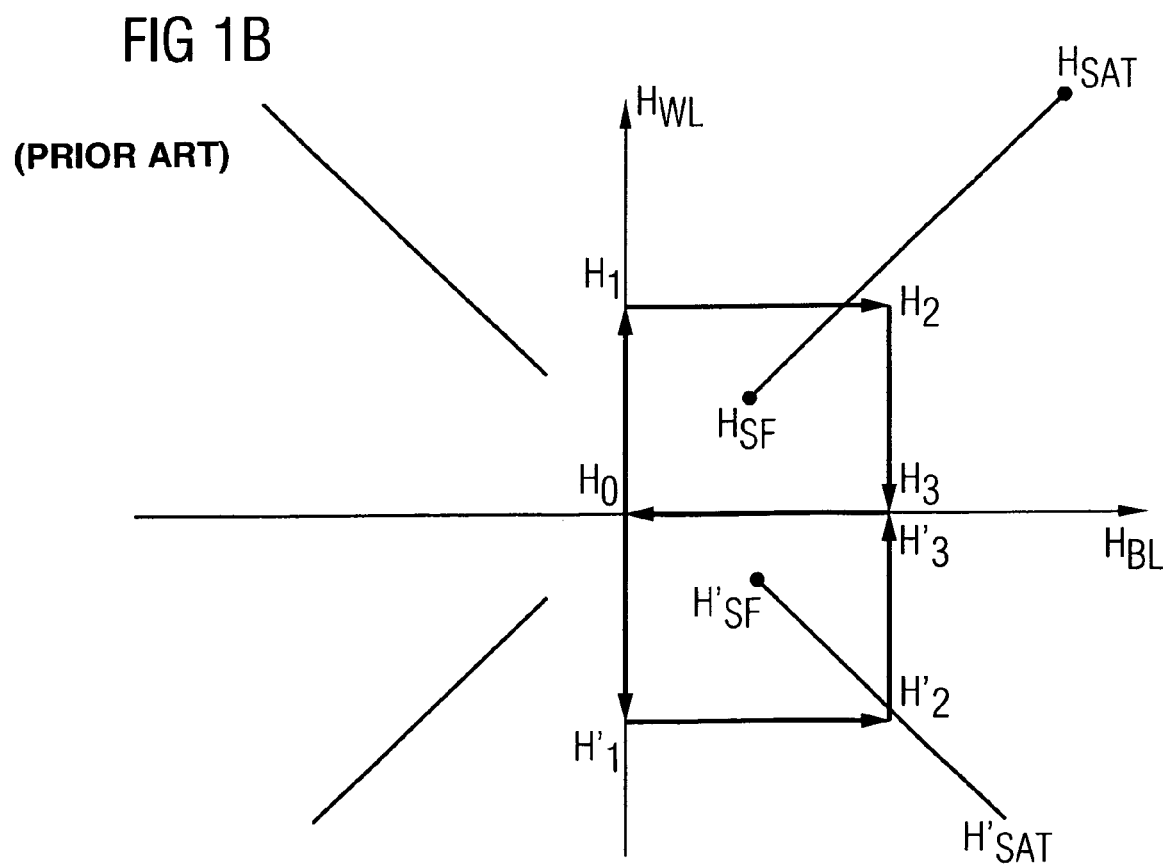

DOUBLE-DECKER MRAM CELL WITH ROTATED REFERENCE LAYER MAGNETIZATIONS

CROSS-REFERENCE TO RELATED APPLICATIONS

This Patent Application is also related to Utility patent application Ser. No. 11/054,735, filed on even date herewith, entitled "DOUBLE-DECKER MRAM CELLS WITH SCISSOR-STATE ANGLED REFERENCE LAYER MAGNETIC ANISOTROPY AND METHOD FOR FABRICATING," and is commonly assigned to the same assignee as the present invention, and which is herein incorporated by reference.

BACKGROUND

The present invention pertains to non-volatile semiconductor magnetoresistive random access memory (MRAM) chips and more particularly is concerned with double-decker MRAM cells where each one of the cells comprises two stacks of magnetic tunnel junctions.

An MRAM cell (also referred to as a tunneling magnetoresistive or TMR-device) includes a structure having ferromagnetic layers respectively exhibiting a magnetic moment vector separated by a non-magnetic layer (or tunneling barrier) and arranged into a magnetic tunnel junction (MTJ). In contrast to present day's non-volatile DRAM memory technology, digital information is not stored by charge but rather is represented in the MRAM cell as directions of magnetic moment vectors (magnetization) in the ferromagnetic layers. More specifically, the magnetic moment vector of one ferromagnetic layer is magnetically fixed (or pinned), while the magnetic moment vector of the other ferromagnetic layer is free to be switched between the two preferred directions in the magnetization easy axis, which typically is arranged to be aligned with the fixed magnetization of the reference layer. Hence, a memory state of an MRAM cell is maintained by the direction of the magnetization of the free layer with respect to the direction of the magnetization of the reference layer. Depending upon the two different magnetic states of the free layer, the MRAM cell exhibits two different resistance values in response to a voltage applied across the magnetic tunneling junction barrier. Accordingly, the particular resistance of the TMR-device reflects the magnetization state of the free layer. In this way, the resistance is low when the magnetization of the free layer is parallel to the magnetization of the reference layer, and high when magnetizations are antiparallel. Hence, a detection of changes in resistance allows to provide information stored in the MRAM cell.

In order to switch MRAM cells, magnetic fields that are coupled to the freely switchable magnetization of the magnetic free layer are applied, which typically are generated by supplying currents to current lines, for example, write bit and write word lines, usually crossing at right angles with an MRAM cell being positioned in an intermediate position therebetween and at an intersection thereof.

Recently, a new concept of MRAM cells ("toggle cells") has been proposed, wherein the free layer is designed to be a free magnetic region including a number of ferromagnetic layers that are antiferromagnetically coupled, where the number of antiferromagnetically coupled ferromagnetic layers may be appropriately chosen to increase the effective magnetic switching volume of the MRAM device. See, for instance, U.S. Pat. No. 6,531,723 B1 to Engel et al., the disclosure of which is incorporated herein by reference.

For switching such magnetoresistive memory cells having a free magnetic region including antiferromagnetically coupled ferromagnetic layers, another switching mechanism, the so-called "adiabatic rotational switching", which is well-known to the skilled persons, is envisaged. The adiabatic rotational switching mechanism is, for example, disclosed in U.S. Pat. No. 6,545,906 B1 to Savtchenko et al., the disclosure of which is incorporated herein by reference. More specifically, adiabatic rotational switching relies on the "spin-flop" phenomenon, which lowers the total magnetic energy in an applied magnetic field by rotating the magnetic moment vectors of the magnetic free region ferromagnetic layers.

Now reference is made to FIG. 1A, where a typical stability diagram for an adiabatic rotation switchable MRAM cell is illustrated, the abscisse of which represents the bit line magnetic field $H_{BL}$, while the ordinate represents the word line magnetic field $H_{WL}$, which respectively arrive at the MRAM cell for its switching. Using the spin-flop phenomenon in an MRAM cell having antiferromagnetically coupled magnetic moment vectors $M_1$ and $M_2$ of the free magnetic region ferromagnetic layers inclined at a 45° angle to the word and bit lines, respectively, a timed switching pulse sequence of applied magnetic fields in a typical "toggling write" mode is described as follows.

At a time to neither a word line current nor a bit line current are applied resulting in a zero magnetic field $H_0$ of both $H_{BL}$ and $H_{WL}$. At a time t1, the word line current is increased to result in magnetic field $H_1$ and magnetic moment vectors $M_1$ and $M_2$ begin to rotate either clockwise or counter-clockwise, depending on the direction of the word line current, to align themselves nominally orthogonal to the field direction. At a time $t_2$, the bit line current is switched on. The bit line current is chosen to flow in a certain direction so that both magnetic moment vectors $M_1$ and $M_2$ are further rotated in the same clockwise or counter-clockwise direction as the rotation caused by the word line magnetic field. At this time $t_2$, both the word and bit line currents are on, resulting in magnetic field $H_2$ with magnetic moment vectors $M_1$ and $M_2$ being nominally orthogonal to the net magnetic field direction, which is 45° with respect to the current lines.

At a time $t_3$, the word line current is switched off, resulting in magnetic field $H_3$, so that magnetic moment vectors $M_1$ and $M_2$ are being rotated only by the bit line magnetic field. At this point of time, magnetic moment vectors $M_1$ and $M_2$ have generally been rotated past their hard axis instability points. Finally, at a time $t_4$, the bit line current is switched off, again resulting in zero magnetic field $H_0$, and magnetic moment vectors $M_1$ and $M_2$ will align along the preferred anisotropy axis (easy axis) in a 180° angle rotated state as compared to the initial state. Accordingly, with regard to the magnetic moment vector of the reference layer, the MRAM cell has been switched from its parallel state into its anti-parallel state, or vice versa, depending on the state switching ("toggling") starts off with.

In order to successfully switch the MRAM cell, it is essential that the magnetic field sequence applied thereon results in a magnetic field path crossing a diagonal line being a straight connection between a minimum switching field $H_{SF}$ ("toggling point") for reversal of the free magnetization and another critical magnetic field value $H_{SAT}$ ("saturation point"), at which both magnetic moment vectors $M_1$ and $M_2$ of antiferromagnetically coupled ferromagnetic layers of the free magnetic region are forced to align with the applied external magnetic field in a parallel configuration.

Usually, the first and third quadrant of the $H_{BL}$-$H_{WL}$-plane are used for switching the cell. Apparently, as can be seen from FIG. 1A, no magnetic fields are applied in the second and fourth quadrant leaving room to operate another (second) magnetic tunnel junction in the same memory cell, the reference layer magnetization is rotated by 90 degrees relative to the first one.

Reference is now made to FIG. 1B. Assuming a second magnetic tunnel junction similar to above (first) magnetic tunnel junction except that it is rotated by 90°, a timed switching pulse sequence of applied magnetic fields in the second quadrant is typically as follows: a time $t_0$ neither a word line current nor a bit line current are applied resulting in a zero magnetic field $H_0$ of both $H_{BL}$ and $H_{WL}$. At a time t1, the word line current being reversed to the previous case is increased to result in magnetic field $H_1$ and magnetic moment vectors $M_1$ and $M_2$ of the second MTJ begin to rotate either clockwise or counter-clockwise, depending on the direction of the word line current, to align themselves nominally orthogonal to the field direction. At a time $t_2$, the bit line current is switched on. The bit line current is chosen to flow in a certain direction so that both magnetic moment vectors $M_1$ and $M_2$ are further rotated in the same clockwise or counter-clockwise direction as the rotation caused by the word line magnetic field. At this time $t_2$, both the word and bit line currents are on, resulting in magnetic field $H_2$ with magnetic moment vectors $M_1$ and $M_2$ being nominally orthogonal to the net magnetic field direction, which is 45° with respect to the current lines. At a time $t_3$, the word line current is switched off, resulting in magnetic field $H_3$, so that magnetic moment vectors $M_1$ and $M_2$ are being rotated only by the bit line magnetic field. At this point of time, magnetic moment vectors $M_1$ and $M_2$ have generally been rotated past their hard axis instability points. Finally, at a time $t_4$, the bit line current is switched off, again resulting in zero magnetic field $H_0$, and magnetic moment vectors $M_1$ and $M_2$ will align along the preferred anisotropy axis (easy axis) in a 180° angle rotated state as compared to the initial state. Accordingly, with regard to the magnetic moment vector of the reference layer, the second MTJ of the MRAM cell has been switched from its parallel state into its anti-parallel state, or vice versa, depending on the state switching starts off with. As with the first cell, magnetic field sequence applied on the second MTJ crosses a diagonal line being a straight connection between a minimum switching field $H_{SF}$ for reversal of the free magnetization and another critical magnetic field value $H_{SAT}$, at which both magnetic moment vectors $M_1$ and $M_2$ of antiferromagnetically coupled ferromagnetic layers of the free magnetic region are forced to align with the applied external magnetic field in a parallel configuration.

As above described, in order to successfully switch two different MTJs in a single memory cell, it is necessary that the free layer magnetizations are inclined at an angle of 90°. Such situation is illustrated in FIG. 2, where a stacked structure 1 of two magnetic tunnel junctions (MTJs) of a memory cell is positioned in between bit and word lines at an intersection thereof and having free and reference layer magnetizations 2, 3 exhibiting a 90° angle in between. (FIG. 2 illustrates different cases of orientations of the two free layer magnetizations, each one having a 90° angle in between.) A possible realization of two different MTJs in a single cell is the so-called "double-decker MRAM cell"-concept having a stacked structure of two MTJs. Using such a double-decker MRAM cell allows for storing two bits of information in a single memory cell. Thus, half the effective cell size per MTJ as compared to the convenient case having only one MTJ per memory cell can be achieved. However, in such double-decker MRAM cell, reference layer magnetizations have to be inclined in an angle of 90° in order to selectively read the MTJs for which reason the pinning layers for pinning of the reference layers in the state of the art necessarily have to be made of different antiferromagnetic materials having sufficiently different setting (Neel) temperatures. Accordingly, optimizing the antiferromagnetic materials such that they have as high a difference in setting temperatures as possible while meeting other requirements like pinning strength, thermal stability etc. is a big challenge and often results in a rather dissatisfying trade-off of desired characteristics. Accordingly, there is a need for the present invention.

SUMMARY

One embodiment of the present invention includes a double-decker MRAM cell with a stacked structure. The stacked structure has first and second magnetic tunnel junctions. Each magnetic tunnel junction includes first and second free and fixed magnetic regions made of magnetic material separated by a first and second tunneling barrier layers made of non-magnetic material. The fixed magnetic regions are pinned by at least one pinning layer. The first and second fixed magnetizations are oriented in a same magnetic anisotropy axis and are inclined under an angle relative to at least one of said first and second free magnetizations.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1A and 1B illustrate stability diagrams of prior art toggle cells in which toggle switching scenarios relating to a single MTJ toggle cell (FIG. 1A) and to a two MTJ (double-decker) toggle cell (FIG. 1B) are illustrated.

DETAILED DESCRIPTION

Figure 2:
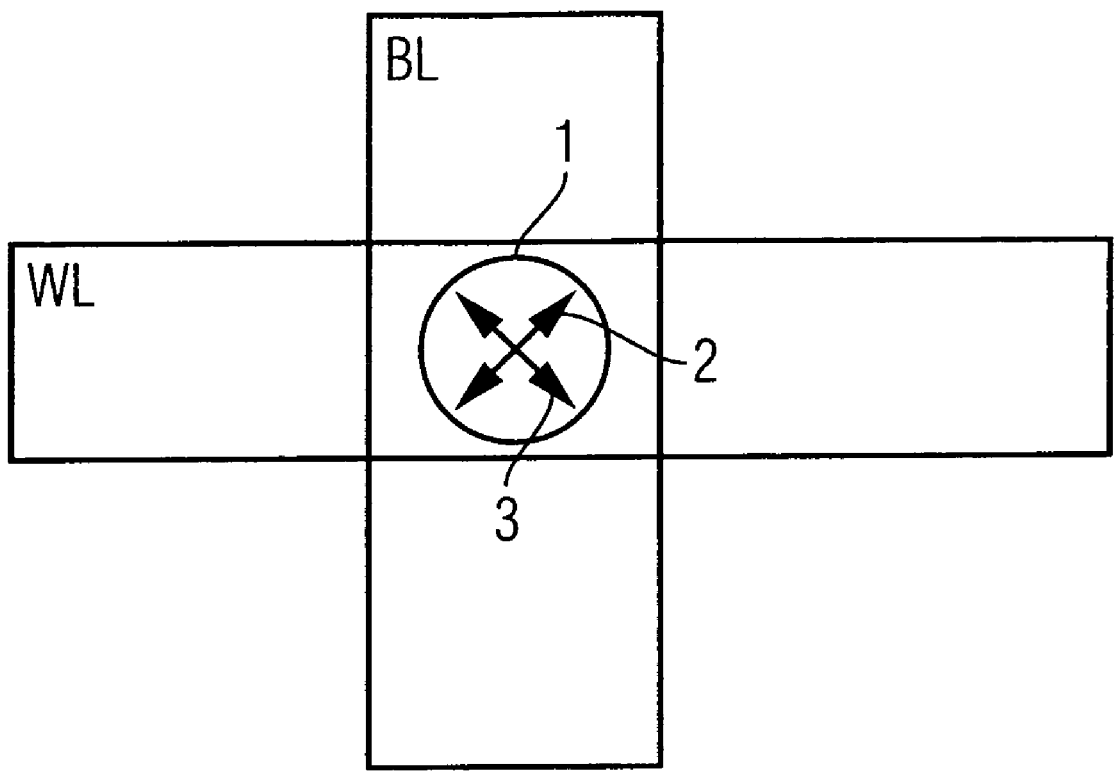
FIG. 2 illustrates a typical configuration of prior art double-decker toggle cell.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

According to one embodiment of the invention, a double-decker MRAM cell is provided having two MTJs in a single cell without the need of necessarily choosing different antiferromagnetic materials for the pinning layers for pinning of reference layers in both MTJs.

According to one embodiment of the invention, a double-decker magnetoresistive random access memory (MRAM) cell is given, which includes a stacked structure having first and second magnetic tunnel junctions (MTJs). In such stacked structure, the first MTJ includes first and second magnetic regions made of magnetic material being stacked in a parallel, overlying relationship and being separated by a first tunneling barrier layer made of non-magnetic material. Also, the first magnetic region exhibits a first fixed magnetization adjacent the first tunneling barrier layer, while the second magnetic region exhibits a first free magnetization adjacent the first tunneling barrier layer which is free to be switched between the same and opposite directions with respect to the first fixed magnetization of the first magnetic region. Further, in such stacked structure, the second MTJ includes third and fourth magnetic regions made of magnetic material being stacked in a parallel, overlying relationship separated by a second tunneling barrier layer made of non-magnetic material. Also, the third magnetic region exhibits a second fixed magnetization adjacent the second tunneling barrier layer, while the fourth magnetic region exhibits a second free magnetization adjacent the second tunneling barrier layer which is free to be switched between the same and opposite directions with respect to the second fixed magnetization of the third magnetic region of the second MTJ. In such stacked structure, the free magnetizations of the first and second MTJs are magnetically coupled to magnetic fields generated by first and second currents made to flow through first and second current lines, respectively. Further, the first and second fixed magnetizations are pinned by at least one pinning layer made of antiferromagnetic material, which is to say that, alternatively, both first and second fixed magnetizations may also be pinned by respective pinning layers. Furthermore, in one embodiment of the invention the first and second fixed magnetizations are oriented in a same magnetic anisotropy axis, that is, the first and second fixed magnetizations may be oriented in a same direction, or, alternatively, may be oriented in opposite directions.

Hence, one embodiment of the present invention uses two reference layers, the fixed magnetizations of which, point in the same or opposite directions, but under a particular angle relative to at least one of the free magnetizations resulting in that the four relevant magnetization states of the two MTJ memory cell become distinguishable.

More particularly, the electric resistance of a single MTJ varies like $R(\Theta)=R0_A-\Delta R_A \cos(\Theta_A-\alpha)$, where $\Theta_A$ is the direction of the free magnetization and $\alpha$ is the angle under which the fixed magnetization is rotated with respect to the free layer direction (that is, with respect to the $\Theta_A=0$ direction).

The series resistance of two MTJs (corresponding to indices A and B) of a double-decker MRAM (toggle) cell in series, where the second free layer magnetization is rotated by 90° relative to the first free layer magnetization, but the two reference layer fixed magnetizations point in the same direction a is $R(\Theta_A,\Theta_B)=R0_A+R0_B-\Delta R_A \cos(\Theta_A)-\Delta R_B \sin(\Theta_B)$, where $\Theta_B$ is the direction of the second free layer magnetization, and it is further assumed that the second reference layer B magnetization is rotated by 180° with respect to reference layer A magnetization.

If one chooses $\Delta R_A=\Delta R_B$ one gets the following resistance values:

| $\Theta_A$ | $\Theta_B$ | $(R - R_{\Theta A} - R_{\Theta B})/\Delta R_A$ |
|---|---|---|
| 180° | 180° | $\cos(\alpha) + \sin(\alpha)$ |
| 180° | 0 | $\cos(\alpha) - \sin(\alpha)$ |
| 0 | 180° | $-\cos(\alpha) + \sin(\alpha)$ |
| 0 | 0 | $-\cos(\alpha) - \sin(\alpha)$ |

Accordingly, the four different resistance states of a double MTJ stack memory cell become distinguishable.

Accordingly, pinning layers for pinning of the first and second fixed magnetizations can be made of the same antiferromagnetic material, and need not be oriented in an orthogonal arrangement. Hence, without having a need of selecting two different antiferromagnetic pinning layer materials provided with substantially different setting temperatures, other requirements like pinning strength, thermal stability etc. can be optimized.

As can be taken from the above calculation, the four resistance values become equidistant if $\cos(\alpha)-\sin(\alpha)=\sin(\alpha)$ or $\alpha=\arctan(\frac{1}{2})=26,56°$.

Hence, according to one embodiment of the invention, the angle as to which the first and second fixed magnetizations are inclined relative to at least one of said first and second free magnetizations amounts to approximately 26.6° resulting in four equidistant resistance values of the double MTJ memory cell.

According to one embodiment of the invention, the second and fourth magnetic regions respectively are comprised of a plurality of N ferromagnetic free layers which are antiferromagnetically coupled, where N is an integer greater than or equal to two. In another case, the second and fourth magnetic regions respectively are comprised of a tri-layered structure including two ferromagnetic layers being antiferromagnetically coupled by an intermediate layer made of antiferromagnetic coupling material.

Figure 3:
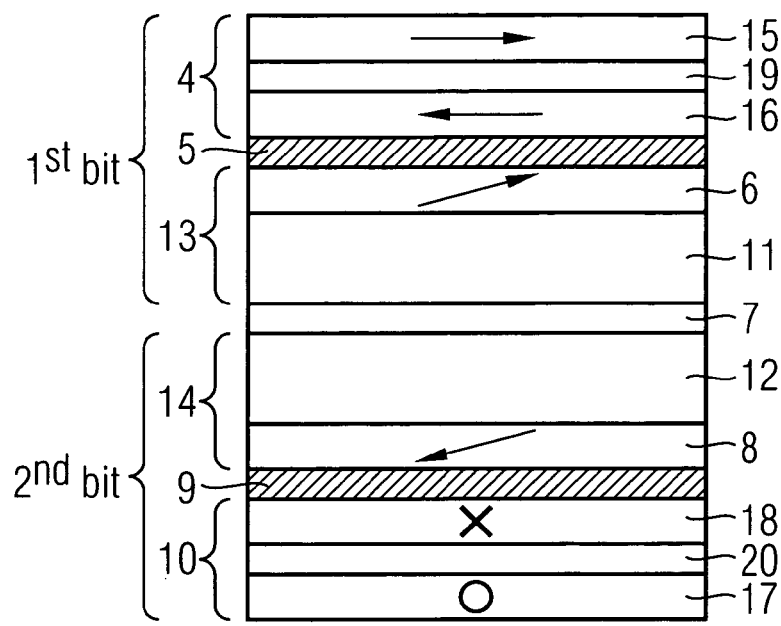
FIG. 3 illustrates a cross-sectional view of a double-decker toggle cell according to one embodiment of the invention.

FIG. 3 illustrates a cross-sectional view of a double-decker toggle cell, which includes a first MTJ having first and second magnetic regions 13, 4 made of magnetic material stacked in a parallel, overlying relationship and separated by a first tunneling barrier layer 5 made of non-magnetic material. The cell also includes a second MTJ which similarly includes third and fourth magnetic regions 14, 10 made of magnetic material stacked in a parallel, overlying relationship and separated by a second tunneling barrier layer 9 made of non-magnetic material. First and second MTJs are separated by conductive layer 7. Each one of the first and third magnetic regions 13, 14 of the first and second MTJs, respectively, includes a pinned magnetization reference layer 6, 8, which respectively are pinned by antiferromagnetic pinning layers 11, 12. The second and fourth magnetic regions 4, 10 of both MTJs exhibit a free magnetization adjacent their respective tunneling barrier layers 5, 9, which is free to be switched between the same and opposite directions with respect to the fixed magnetization of the respective reference layer 6, 9 fixed magnetizations. Further, the second and fourth magnetic regions 4, 10 of both MTJs respectively are comprised of a tri-layered structure including two ferromagnetic layers 15, 16 and 17, 18 which respectively are antiferromagnetically coupled by intermediate layers 19, 20 made of antiferromagnetic coupling material. First and second antiferromagnetic materials of antiferromagnetic pinning layers 11, 12 are chosen to be made of the same material.

As can be taken from FIG. 3, the antiparallely coupled free layer system of the fourth magnetic region 10 is rotated by 90° relative to the antiparallely coupled free layer system of the second magnetic region 4. Furthermore, first and second fixed magnetizations of reference layers 6, 8 are aligned in an opposite direction as to each other and, further, in a plane parallel as to the antiparallely coupled free layer system of the second and fourth magnetic regions 4, 10 are rotated under an angle of 26,56° relative to at least one of the first and second free magnetizations which results in four equidistant resistance values.

Figure 4:
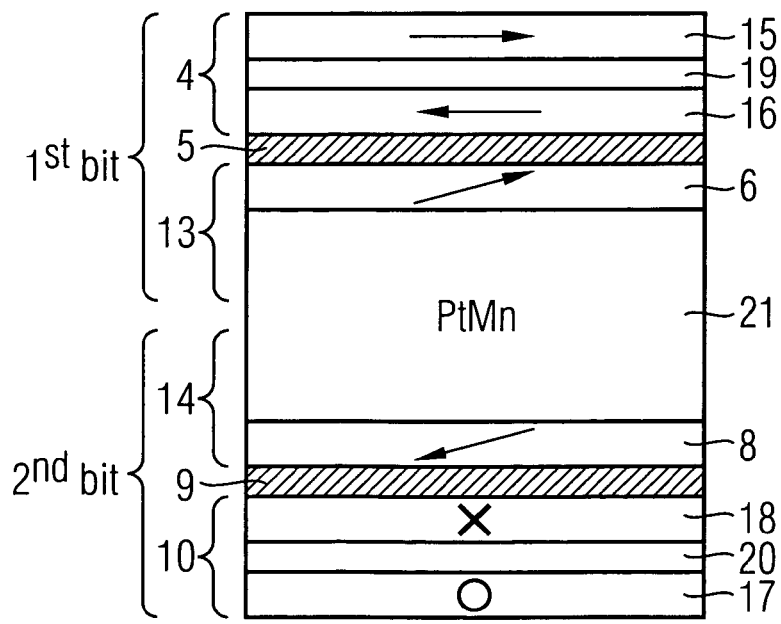
FIG. 4 illustrates a cross-sectional view of a double-decker toggle cell according to an alternative embodiment of the invention.

Reference is now made to FIG. 4 which illustrates a cross-sectional view of a double-decker toggle cell according to an alternative embodiment of the invention. In order to avoid unnecessary repetitions, only the differences as to the embodiment of FIG. 3 are explained, otherwise reference is made to the description made in connection with FIG. 3. In the double MTJ toggle cell of FIG. 4, only one single antiferromagnetic pinning layer 21 instead of first and second antiferromagnetic pinning layers 11, 12 as in FIG. 3 is arranged. For this purpose, single antiferromagnetic pinning layer 21 has to be sufficiently thick to ensure pinning action for both first and second fixed magnetizations of first 6 and second 8 reference layers. The single antiferromagnetic layer 21 may be made of PtMn, however, other antiferromagnetic materials are also possible.

Obviously many modifications and variations of the present invention are possible in light of the above description. It is therefore to be understood, that within the scope of appended claims, the invention may be practiced otherwise than as specifically devised.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A double-decker magnetoresistive random access memory (MRAM) cell comprising:
    a first magnetic tunnel junction including first and second magnetic regions made of magnetic material being stacked in a parallel, overlying relationship;
    a first tunneling barrier layer made of non-magnetic material separating the first and second magnetic regions;
    wherein the first magnetic region exhibits a first fixed magnetization adjacent the said first tunneling barrier layer, and wherein the second magnetic region exhibits a first free magnetization adjacent the first tunneling barrier layer that is free to be switched between the same and opposite directions with respect to the first fixed magnetization;
    a second magnetic tunnel junction including third and fourth magnetic regions made of magnetic material being stacked in a parallel, overlying relationship;
    a second tunneling barrier layer made of non-magnetic material separating the third and fourth magnetic regions;
    wherein the third magnetic region exhibits a second fixed magnetization adjacent the second tunneling barrier layer, and wherein the fourth magnetic region exhibits a second free magnetization adjacent the second tunneling barrier layer that is free to be switched between the same and opposite directions with respect to the second fixed magnetization;
    at least one pinning layer made of antiferromagnetic material pinning the first and second fixed magnetizations;
    first and second currents made to flow through first and second current lines, respectively carrying first and second currents, which generate magnetic fields that magnetically couple the free magnetizations of the first and second magnetic tunnel junctions;
    wherein the second and fourth magnetic regions are respectively comprised of a plurality of N ferromagnetic free layers which are antiferromagnetically coupled, where N is an integer greater than or equal to two;
    wherein the first and second fixed magnetizations are oriented in a same magnetic anisotropy axis and are inclined under an angle relative to at least one of the first and second free magnetizations; and
    wherein said first and second free magnetizations are inclined at an angle of 90 degrees.

2. The double-decker MRAM cell of claim 1, wherein the first and second fixed magnetizations are oriented in a same direction.

3. The double-decker MRAM cell of claim 1, wherein the first and second fixed magnetizations are oriented in opposite directions.

4. The double-decker MRAM cell of claim 1, wherein the angle as to which said first and second fixed magnetizations are inclined relative to at least one of the first and second free magnetizations amounts to about 26.6°.

5. The double-decker MRAM cell of claim 1, wherein the second and fourth magnetic regions are respectively comprised of a tri-layered structure including two ferromagnetic layers being antiferromagnetically coupled by an intermediate layer made of antiferromagnetic coupling material.

6. The double-decker MRAM cell of claim 1, wherein both of the first and second fixed magnetizations are respectively pinned by a separate pinning layer made of antiferromagnetic material.

7. The double-decker MRAM cell of claim 1, wherein both of the first and second fixed magnetizations are respectively pinned by a single pinning layer made of antiferromagnetic material.

8. A double-decker magnetoresistive random access memory cell comprising:
    a first magnetic tunnel junction having first and second magnetic regions stacked in parallel;
    a first tunneling barrier layer made of non-magnetic material separating the first and second magnetic regions;
    wherein the first magnetic region has a first fixed magnetization adjacent the first tunneling barrier layer that is free to be switched between the same and opposite directions with respect to the first fixed magnetization;

a second magnetic tunnel junction having third and fourth magnetic regions stacked in parallel;

a second tunneling barrier layer made of non-magnetic material separating the third and further magnetic regions;

wherein the third magnetic region has a second fixed magnetization adjacent the second tunneling barrier layer that is free to be switched between the same and opposite directions with respect to the second fixed magnetization;

means for pinning the first and second fixed magnetization;

means for magnetically coupling the free magnetization of the first and second magnetic tunnel junctions wherein the second and fourth magnetic regions are respectively comprised of a plurality of N ferromagnetic free layers which are antiferromagnetically coupled, where N is an integer greater than or equal to two;

wherein the first and second fixed magnetizations are oriented in a same magnetic anisotropy axis and are inclined under an angle relative to at least one of the first and second free magnetizations; and wherein said first and second free magnetizations are inclined at an angle of 90 degrees.

9. The double-decker MRAM cell of claim 8, wherein the first and second fixed magnetizations are oriented in a same direction.

10. The double-decker MRAM cell of claim 8, wherein the first and second fixed magnetizations are oriented in opposite directions.

11. The double-decker MRAM cell of claim 8, wherein the angle as to which said first and second fixed magnetizations are inclined relative to at least one of the first and second free magnetizations amounts to about 26.6°.

12. The double-decker MRAM cell of claim 8, wherein the second and fourth magnetic regions are respectively comprised of a tri-layered structure including two ferromagnetic layers being antiferromagnetically coupled by an intermediate layer made of antiferromagnetic coupling material.

13. The double-decker MRAM cell of claim 8, wherein both of the first and second fixed magnetizations are respectively pinned by a separate pinning layer made of antiferromagnetic material.

14. The double-decker MRAM cell of claim 8, wherein both of the first and second fixed magnetizations are respectively pinned by a single pinning layer made of antiferromagnetic material.

* * * * *